United States Patent [19]
Toshima

[11] Patent Number: 5,944,940
[45] Date of Patent: Aug. 31, 1999

[54] WAFER TRANSFER SYSTEM AND METHOD OF USING THE SAME

[75] Inventor: Masato Toshima, Sunnyvale, Calif.

[73] Assignee: Gamma Precision Technology, Inc., Santa Clara, Calif.

[21] Appl. No.: 08/889,172

[22] Filed: Jul. 8, 1997

Related U.S. Application Data

[63] Continuation-in-part of application No. 08/677,136, Jul. 9, 1996.

[51] Int. Cl.[6] ..................................................... C23F 1/08
[52] U.S. Cl. ...................... 156/345; 118/719; 118/723 E; 118/723 I; 118/730; 204/298.25; 204/298.35; 414/217; 414/220; 414/936; 414/937; 414/938; 414/939; 414/940
[58] Field of Search ....................... 438/716; 204/298.25, 204/298.35; 118/719, 723 E, 723 I, 730; 414/217, 219, 220, 930, 936–940; 156/345 C, 345 PC, 345 PH, 345 PW, 345 WH, 345 MC, 345

[56] References Cited

U.S. PATENT DOCUMENTS

| | | | |
|---|---|---|---|
| 4,795,299 | 1/1989 | Boys et al. ................................ | 414/217 |
| 4,832,778 | 5/1989 | Davis et al. .............................. | 156/345 |
| 5,013,385 | 5/1991 | Maher et al. ............................. | 156/345 |
| 5,133,284 | 7/1992 | Thomas et al. ........................... | 118/719 |
| 5,198,634 | 3/1993 | Mattson et al. ....................... | 219/121.43 |
| 5,292,393 | 3/1994 | Maydan et al. ........................... | 156/345 |
| 5,302,209 | 4/1994 | Maeda et al. ............................ | 118/719 |
| 5,346,578 | 9/1994 | Benzing et al. .......................... | 156/345 |
| 5,405,480 | 4/1995 | Benzing et al. .......................... | 156/345 |
| 5,611,861 | 3/1997 | Higashi .................................... | 118/719 |
| 5,698,035 | 12/1997 | Matsudo et al. ..................... | 118/723 E |
| 5,759,268 | 6/1998 | Begin et al. .............................. | 118/719 |
| 5,766,404 | 6/1998 | Rigali et al. ............................. | 118/719 |
| 5,795,452 | 8/1998 | Kinoshita et al. ................. | 204/298.37 |

*Primary Examiner*—Bernard Codd
*Attorney, Agent, or Firm*—Lyon & Lyon LLP

[57] ABSTRACT

A wafer transfer system is described for transferring a wafer while at substantially the same time another wafer is being processed. The wafer transfer system comprises, in one embodiment, a transfer chamber having a wafer transfer blade, a load lock chamber coupled to the transfer chamber, an atmospheric robot for loading and unloading the wafer into the load lock chamber, and a slider coupled to the wafer transfer blade for moving the wafer transfer blade between the transfer chamber and the load lock chamber. According to a preferred embodiment, the slider utilizes a magnetic coupling mechanism. In a further embodiment, a device comprising a transfer chamber coupled to a plurality of plasma sources capable of simultaneously or sequentially providing different plasma structures within the transfer chamber, is described.

2 Claims, 11 Drawing Sheets

WAFER TRANSFER SYSTEM AND METHOD OF USING THE SAME

RELATED APPLICATION

This application is a continuation-in-part of co-pending U.S. application Ser. No. 08/677,136, filed Jul. 9, 1996, entitled "A Wafer Transfer system and Method of Using Same", and incorporated by reference as if filly set forth herein.

FIELD OF THE INVENTION

The field of our invention relates generally to semiconductor manufacturing. More particularly this invention relates to an apparatus and method for stripping resist from a substrate in a transfer chamber, while at substantially the same time, another substrate is being transferred between a load lock chamber and the transfer chamber of the system. The present invention also relates to an apparatus and method for performing complex multi-step applications simultaneously or sequentially. As a result of the disclosures of this invention, throughput is increased because processing and transferring of the substrate occurs in parallel instead of as two separate events and because multi-step processes can be carried out in a more efficient manner.

DESCRIPTION OF RELATED ART

During the process of semiconductor fabrication, photoresist, a light sensitive film, is often deposited on a wafer surface and then "exposed" using high intensity light through a mask. The exposed photoresist is then dissolved off the wafer with developers. The pattern of photoresist remaining after development will prevent subsequent etch or implant operations in some areas while allowing etching or implant in other areas. Once the etch or implant operation is completed, the remaining photoresist is removed or stripped from the wafer surface.

A prior art system for removing photoresist 100 from a wafer is illustrated in FIG. 1. The prior art system comprises a load lock chamber 125 and a transfer chamber 105. A complicated robot 130 with one platen 135, a first cassette stage 140 for holding wafers and a second cassette stage 150 are disposed within the load lock chamber 125. The transfer chamber 105 includes six fins (111a–110f) mounted to a common center 120 on one end of each fin. The other end of each of the fins (110a–110f) is attached to a processing stage (115a–115f) which is coupled to each fin. There are six processing stages (115a–115f) in the transfer chamber 105.

Under the prior art system 100, the tact time was defined as the sum of the process time (typically about 15 seconds) plus loading time (typically about twenty-seven seconds) for a total of forty-two seconds. The process time is defined as the time that a wafer spends at each stage (e.g., 115a) in the transfer chamber 105 and the loading time is defined as the amount of time spent transferring a new (meaning "unprocessed" by system 100) or processed wafer between the load lock chamber 125 and the transfer chamber 105. Under the prior art system, when a wafer was being processed, another wafer could not be loaded. The converse was also true; when a wafer was being loaded, another wafer could not be processed. Thus, the wafer processing time and the wafer loading time were two separate events in the prior art system 100.

A typical loading sequence would comprise the following actions. With the load lock chamber 125 at atmospheric pressure, cassettes containing unprocessed wafers would be manually placed onto cassette stages 140 and 150. The load lock chamber 125 would then be sealed and the pressure reduced to the same pressure as that maintained in transfer chamber 105. Fin 110a would move up while the robot 130 would move with its platen 135 toward the fin 110a. The fin 110a would move down and transfer the processed wafer on to the platen 135 of the robot 130. The robot 130 would then retract and rotate toward a first cassette stage 140 or a second cassette stage 150. Assuming that the robot rotated toward first cassette stage 140, the robot 130 would then extend its platen 135 toward first cassette stage 140. The robot 130 would index and transfer the processed wafer back into the first cassette stage 140. After doing this, the robot 130 would retract and then index forward to the next wafer slot on the first cassette stage 140. The robot 130 would extend its platen 135 toward the first cassette stage 140. The robot 130 would index so that a new wafer is transferred onto the robot's platen 135. The robot 130 would then retract and rotate toward fin 110a. The robot 130 would then extend the platen 135 toward the fin 110a. The fin 110a would move up to receive the new wafer. The robot 130 would retract after the wafer was transferred to the fin 110a. The fin 110a would then rotate towards processing stage 115b and then move down so that fin 110a is now located where fin 110b was located. In other words, all six fins (110a–110f) have moved in a counterclockwise direction since all six fins (110a–110f) are attached to a common center 120. Thus, fin 110a will then move down so that the wafer is now on processing stage 115b. The entire sequence of events typically takes about 27 seconds to load a new wafer into the transfer chamber and unload a processed wafer from the transfer chamber to the load lock chamber and then back into a cassette stage (140 or 150). Meanwhile, all processing stops during this transfer sequence.

Once a new wafer is introduced into the transfer chamber 105, processing of the wafer begins. The processing time usually takes about 15 seconds. While a wafer is being processed in the transfer chamber 105, the robot 130 is inactive and no wafers are being loaded or unloaded between the load lock chamber 125 and the transfer chamber 105.

When a second wafer is introduced into the transfer chamber 105, the first wafer which was on processing stage 115 will be moved to processing stage 115c so that the new wafer may be placed on processing stage 115b. However, during the loading and unloading sequence, the processing of the wafers inside the transfer chamber 105 must cease. Thus, throughput is greatly reduced because the wafers cannot be processed in parallel with the wafers being loaded and unloaded between the load lock chamber 125 and the transfer chamber 105.

Another solution that was tried is a robot with two blades or platens spaced 180 degrees apart is placed in the load lock chamber. One of the blades picks up a new wafer from a cassette stage while a second blade removes a processed wafer from the transfer chamber and places the wafer back in the cassette stage. This solution was an improvement over the prior art system 100 described in FIG. 1, but it still did not solve the problem of processing wafers apart from the transferring of wafers between the load lock chamber 5 and the transfer chamber.

It was a common belief that if one sacrificed one of the process stages in the transfer chamber to act solely as a loading and unloading station, then a loss in throughput would occur. Therefore, all the previous solutions continued to utilize all six wafer stages as processing stages and to separate the processing of wafers from the transferring of wafers into two events. It was also believed that if one introduced a complicated mechanism inside a process environment, it would create a contamination problem for the wafers. Thus, most of the complicated robotic mechanisms used were in the load lock chamber and not in the transfer chamber where the processing occurred.

With regard to multi-step applications, the prior art generally required the use of separate machines for performing the separate steps. In another approach, a robot was placed in the center of the transfer chamber and isolatable antechambers were appended to the transfer chamber. The robot transferred wafers to be processed from one antechamber to another. The complicated motions which the robot was required to perform to accomplish the transferral of wafers from one antechamber to another took a long time to do resulting in inefficient, costly processing.

Thus, what is needed is a wafer transfer mechanism that will allow the wafer loading time to substantially parallel the wafer processing time in order to increase throughput at a reduced cost and without introducing contamination concerns into the process environment. Further, with regard to multi-step applications, what is needed is a device capable of performing such multi-step applications in an efficient and cost-effective manner.

SUMMARY

The present invention describes an apparatus and method for processing a wafer in a transfer chamber, while at substantially the same time, another wafer is being transferred between a load lock chamber and the transfer chamber of a wafer transfer system.

According to a preferred embodiment, the wafer transfer system comprises a transfer chamber having a wafer transfer blade disposed within the transfer chamber, a load lock chamber coupled to the transfer chamber, and a slider, located within the transfer chamber, which slider moves the wafer transfer blade between the transfer chamber and the load lock chamber while processing continues in parallel in the transfer chamber. The wafer transfer blade is capable of transferring a wafer between the transfer chamber and the load lock chamber.

In a further embodiment, the present invention claims a method of processing and transferring a wafer in a system comprising a load lock chamber and a transfer chamber having a stage. The method comprises the following steps: providing radio-frequency (RF) power of a predetermined amount; providing a gas flow that will become a plasma; and determining a tact time, wherein the tact time is the sum of the processing time and the fin index time. The processing time is defined as the processing time that a wafer undergoes while on a processing stage. The fin index time is defined as the time that it takes for a first fin to transfer a wafer from one processing stage to another processing stage or between the wafer transfer blade and a processing stage. The loading time for the wafer substantially parallels the processing time and covers the following steps. First, the wafer transfer blade extends toward the load lock chamber to deposit the processed wafer into a shelf of the wafer holder. Second, the wafer transfer blade retracts. Third, the wafer holder indexes to the next wafer slot. Fourth, the wafer transfer blade extends and then the wafer holder indexes so that a new wafer is deposited on the wafer transfer blade. Finally, the wafer transfer blade retracts so that the new wafer is being processed in the transfer chamber. Thus, wafers are processed in the transfer chamber while new and processed wafers are transferred between the load lock chamber and the transfer chamber. The result is higher throughput, lower manufacturing costs, smaller space occupancy for the system and higher reliability.

In yet another aspect, the present invention claims an apparatus having multiple plasma sources attached to a transfer chamber wherein the plasma structure generated by each of, or any combination of, plasma sources may be different. Each plasma source is directed toward a individual substrate within the transfer chamber. The stages on which the substrates rest during processing are independently temperature controlled. Thus substrates can be exposed to a multiplicity of processing environments within the same transfer chamber. If the processing environments are compatible with each other, two or more steps can be carried out simultaneously; if the processing environments are not compatible, the steps can be performed sequentially.

BRIEF DESCRIPTION OF THE DRAWINGS

The present invention is illustrated by way of example and not a limitation in the figures of the accompanying drawings in which like references indicate similar elements and in which.

DETAILED DESCRIPTION

A transfer system and method for using the same are described for processing a substrate, such as stripping the resist from a wafer surface, in a transfer chamber while, at substantially the same time, another substrate or wafer is being transferred between a load lock chamber and the transfer chamber. In the following description, numerous specific details are given to provide a thorough understanding of the invention, such as the use of a magnetic motion coupling mechanism or the use of a vacuum chuck coupled to a platen. However, it will be obvious to one skilled in the art that the invention may be practiced without these specific details. Moreover, in some instances, well-known semiconductor equipment and processes have not been set forth in detail in order not to unnecessarily obscure the present invention.

Figure 1:
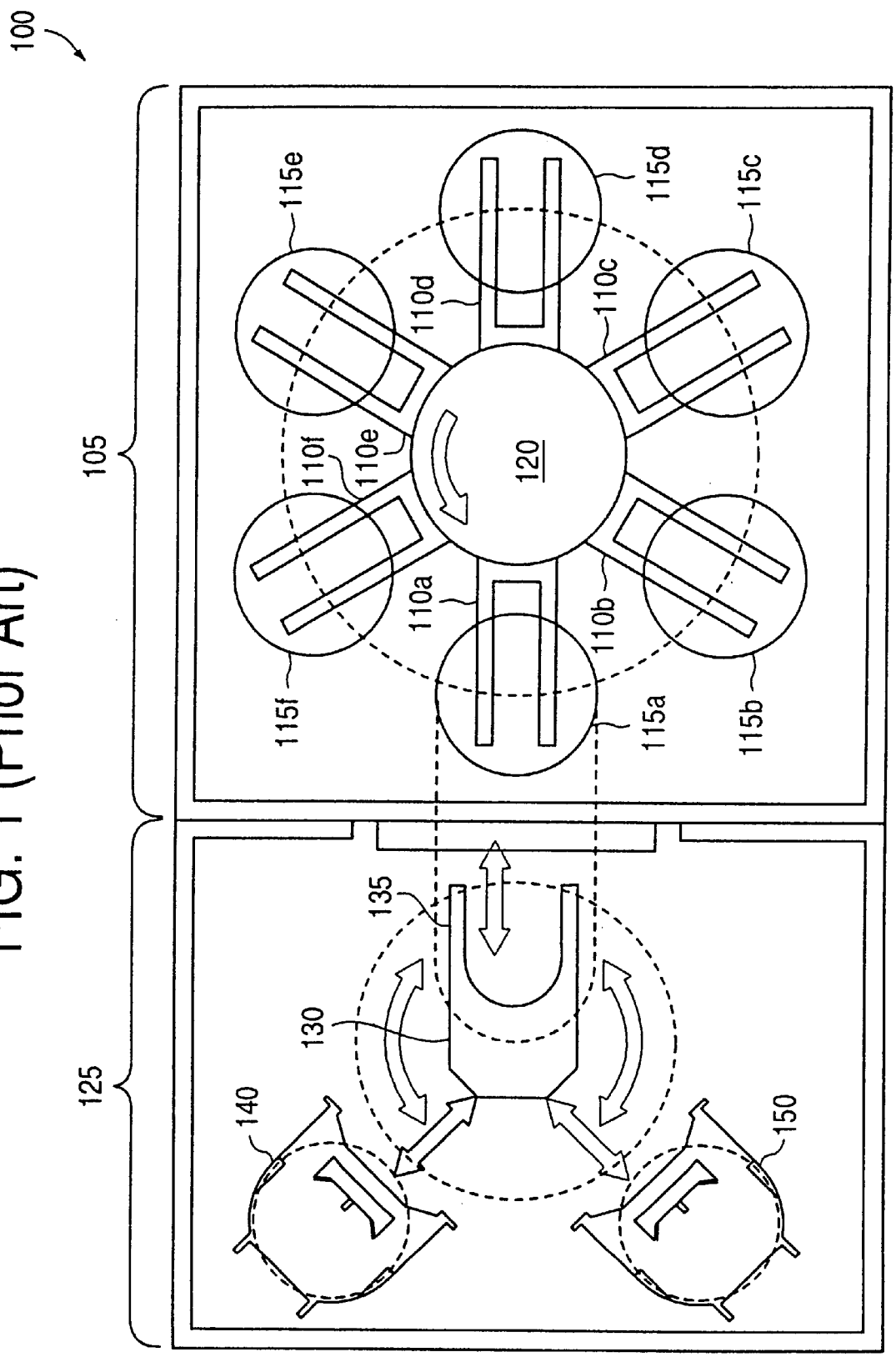
FIG. 1 is an example of a prior art processing system.
Figure 2:
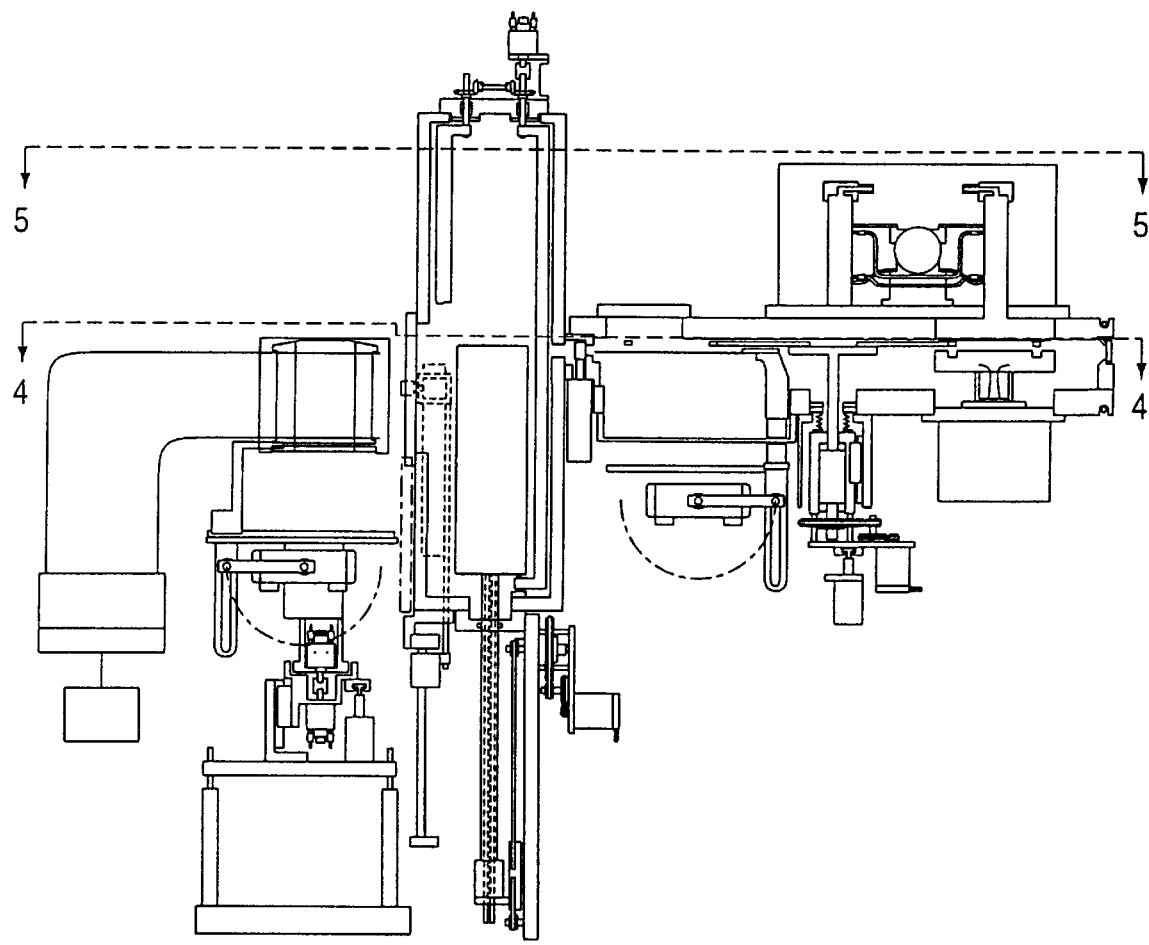
FIGS. 2, 2A and 2B illustrate a side view of the present wafer transfer system.
Figure 2A:
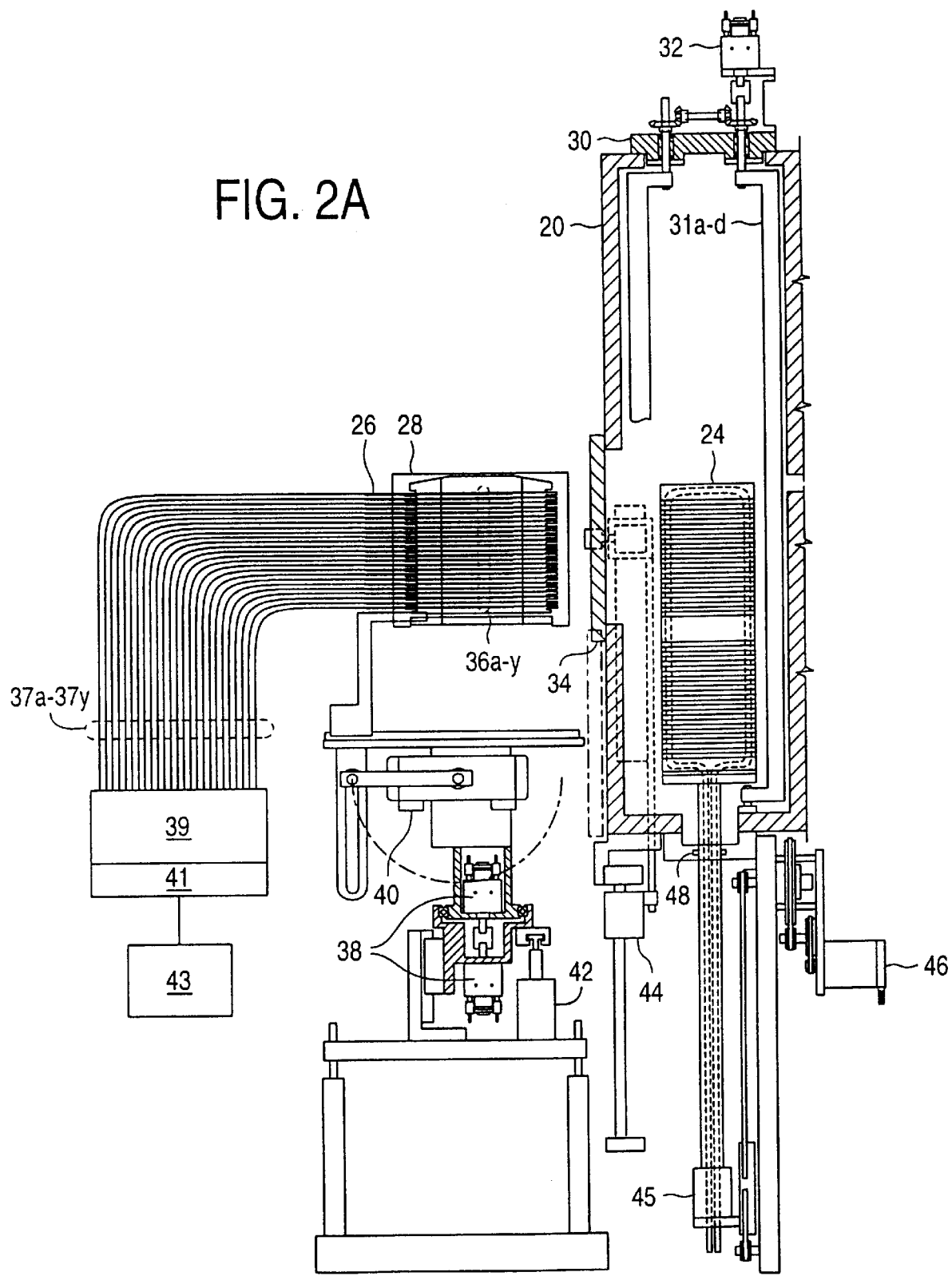
Figure 2B:
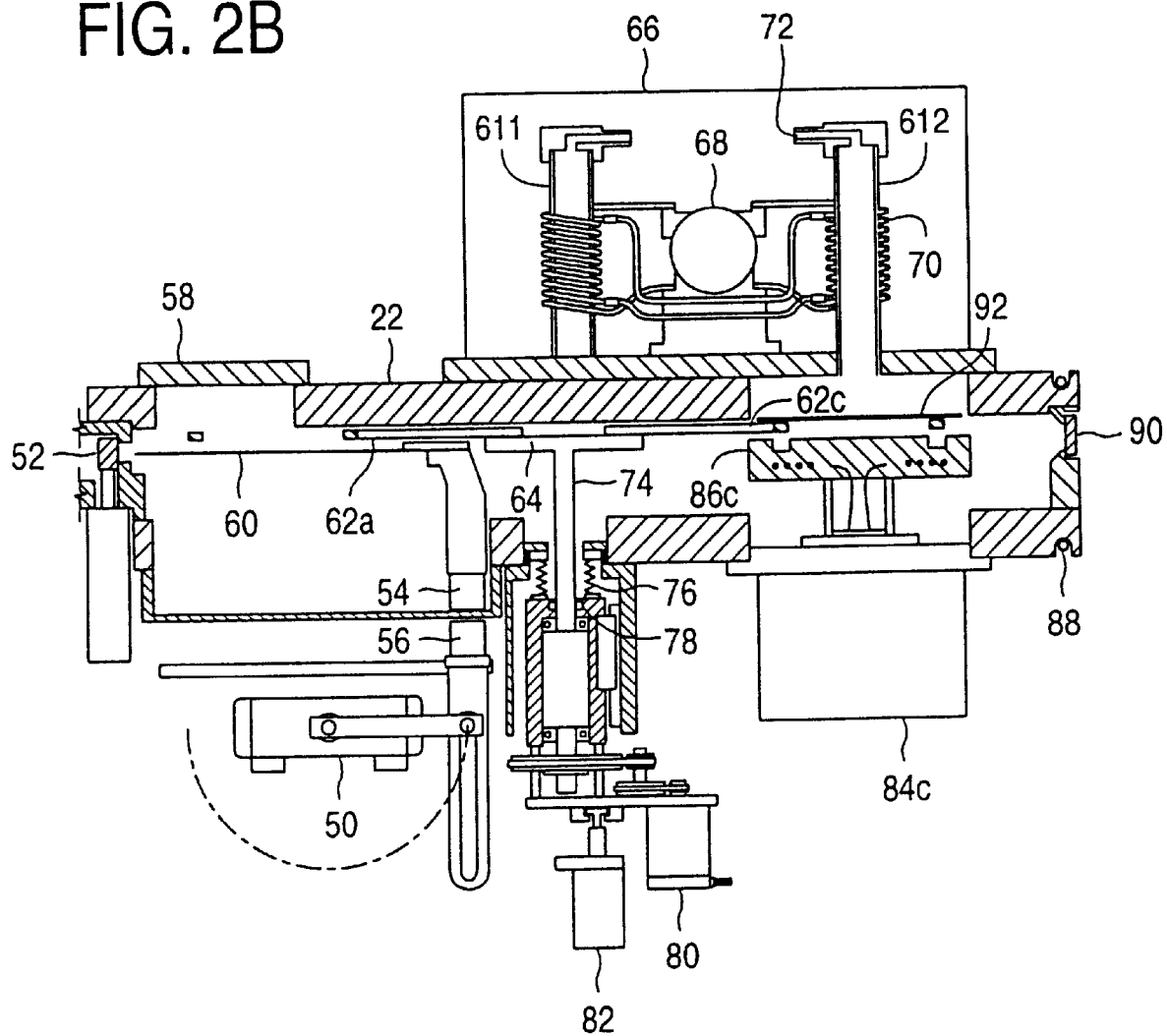

FIG. 2 discloses an apparatus and method for stripping the photoresist from a wafer surface, while at substantially the same time, another wafer is transferred between the load lock chamber and the transfer chamber. A side view of a preferred embodiment of the present invention is illustrated in FIGS. 2, 2A and 2B. Cassette stages 28 are located outside a load lock chamber 20. Load lock chamber 20 is connected to a transfer chamber 22 where the processing of a wafer occurs. A wafer holder 24 having a plurality of shelves is located in load lock chamber 20. The wafer holder 24 has a plurality of shelves for holding wafers before the wafers are transferred between the robot 26 and the transfer chamber 22. In a preferred embodiment, wafer holder 24 has two compartments, wherein each compartment has twenty-five shelves and is capable of holding twenty- five wafers.

Cassettes holding a plurality of unprocessed wafers are placed on cassette stages 28. The cassettes may be placed on and removed from cassette stages 28 manually or, in another aspect of this invention, automatically using an additional robot located remote to cassette stages 28.

The robot 26 retrieves a new (not yet processed in transfer chamber 22) wafer from cassette stage 28 located outside of the load lock chamber 20. According to a preferred embodiment, robot 26 has 25 platens 36a–36y which are capable of receiving twenty-five wafers at one time from cassette stage 28. Each of the platens 36a–36y has its own vacuum chuck for supporting a wafer during transport. Each platen 36a–36y is connected to its respective vacuum line 37a–37y which is connected to a manifold 39 which is then connected to a valve 41 and a vacuum pump 43.

A rotation pneumatic actuator 38 allows robot 26 to rotate between gate valve 34 of load lock chamber 20 and cassette stage 28. Gate valve 34 is opened whenever a wafer is being transferred between load lock chamber 20 and cassette stages 28. A retract-extend pneumatic actuator 40 allows robot 26 to extend toward cassette stage 28 or wafer holder 24 to either receive or transfer a wafer. Finally, an up-down pneumatic actuator 42 allows robot 26 to move up and down between the shelves of cassette stage 28 and the shelves of wafer holder 24. Unlike previous robots, the robot 26 is capable of receiving twenty-five wafers at one time from cassette stage 28 and then transferring all twenty-five wafers to the wafer holder 24. The converse of the prior sequence for robot 26 is also true. Thus, throughput is increased because robot 26 is able to transfer more than one wafer at a time.

In another aspect of the present invention, wafer holder 24 has an additional compartment disposed directly beneath the two compartments which hold new and processed wafers. The additional compartment is likewise capable of holding a plurality of wafers; in a preferred embodiment of this invention the additional compartment has six (6) shelves capable of holding six (6) wafers. The additional compartment is used to hold dummy wafers; i.e., wafers which have not been coated with photoresist, exposed through a mask, etc. These dummy wafers are used in the following manner:

When the apparatus is in operation, the first five wafers and the last five wafers are processed with some of stages 86a–86f empty. However, some process applications are extremely sensitive to the overall processing environment and/or to the condition of the stages. That is, the first wafer through is a "pioneer" and at each of stages 86a–86f, it is the first wafer to be placed on and processed at that stage. The condition of the stage for the pioneer wafer is thus different than it will be for the second and all subsequent wafers which will be placed on each succeeding stage when the stage is vacated by the preceding wafer. Likewise, when there are less than six wafers remaining in transfer chamber 22 to be processed, one or more stages 86a–86f will be empty. Differences in the environment within transfer chamber 22 as the result of some stages being empty may have a deleterious effect on the last five wafers to be processed. The present invention eliminates both of these situations. The operator is provided with a recipe which can be invoked to load dummy wafers from the additional six-shelf compartment of wafer holder 24 onto one or more of stages 86a–86f. This can occur before or after actual wafers to be processed are loaded from wafer holder 24 into the transfer chamber 22. Thus, in one aspect, if a particular application is not sensitive to the overall environment in transfer chamber 22, a single dummy wafer may be loaded as the pioneer wafer and actual wafers to be processed loaded next. If the application is sensitive to the overall environment in transfer chamber 22, dummy wafers may be placed on all six stages 86a–86f before the first wafer to be processed is introduced into transfer chamber 22. Likewise, when the last five wafers are being processed, dummy wafers can be loaded behind the processing wafers; i.e., on the stages being vacated by the last of the processing wafers so that all stages always contain a wafer. The dummy wafers can be used for many processing cycles.

Referring to FIG. 2A, load lock chamber 20 has a wafer centering mechanism 30 controlled by a pneumatic actuator 32 which moves the four centering bars 31a–d to center the wafers within wafer holder 24 every time before a wafer is removed from wafer holder 24. Centering bars 31a–d are four vertical bars which operate in a synchronous manner on four rotating anises. In addition, load lock chamber 20 has a gate valve 34 which isolates it from the atmosphere and a slit valve 52 (see FIG. 2B) which isolates it from transfer chamber 22. Gate valve 34 remains closed when wafers are being processed in transfer chamber 22. The vertical motion of gate valve 34 is controlled by pneumatic actuator 44. In addition, motor 46 controls the up and down motion of wafer holder 24 while linear motion vacuum seal 48 helps maintain the vertical motion of wafer holder 24. Moreover, wafer holder weight 45 is used as part of the counter balancing mechanism of load lock chamber 20, which is discussed in greater detail in FIG. 3.

A service window 58 allows one to see the processing of a wafer in transfer chamber 22. A wafer transfer blade 60, located below service window 58, is retracted and extended by a pneumatic actuator 50. Pneumatic actuator 50 is coupled to a magnetic motion coupling mechanism comprising a first magnet 54 located within transfer chamber 22 and a second magnet 56 located outside transfer chamber 22. Unlike previous systems, wafer transfer blade 60 is located inside transfer chamber 22 which allows the transfer of wafers to occur at substantially the same time or in parallel with the processing of wafers. In addition, wafer transfer blade 60 does not replace a processing stage, there still being six processing stages 86a–86f available in addition to wafer transfer blade 60. Thus the inclusion of wafer transfer blade 60 inside transfer chamber 22 does not result in a reduction of throughput.

In order to reduce the possibility of contamination, wafer transfer blade 60 moves in response to a simple magnetic motion coupling mechanism instead of a complicated gear or machine set. When second magnet 56 moves, first magnet 54 also moves and since first magnet 54 is coupled to wafer transfer blade 60, wafer transfer blade 60 also moves. It is to be appreciated that wafer transfer blade 60 may move in response to another mechanism without departing from the spirit and scope of the present invention. When slit valve 52 is open, wafer transfer blade 60 is able to extend into load lock chamber 20 to either receive a new wafer or deposit a processed wafer into a shelf of wafer holder 24.

In a preferred embodiment, there are seven fins 62a–62g located in transfer chamber 22. Only two fins 62a and 62c are shown in FIG. 2B. Each of the seven fins 62a–62g are connected to a central hub 64 which is connected to a drive shaft 74, bellows 76 and a rotation vacuum seal 78. Therefore, all seven fins 62a–62g rotate and move simultaneously. The rotation movement of the fins 62a–62g from one wafer stage 86 to another is controlled by a fin rotation motor 80. There are six wafer processing stages 86a–86f (only 86c is shown in FIG. 2B) which are arranged with wafer transfer blade 60 in a concentric manner in transfer chamber 22. In addition, the vertical motion of the fin 62 as it moves up and away from, for example, wafer stage 86a and down toward wafer stage 86b, is controlled by pneumatic actuator 82. Each of the wafer stages 86a–86f has its own wafer stage controller 84a–84f but only one controller 84c is shown in FIG. 2B. A wafer 92 is shown on top of wafer stage 86.

Sometimes the temperature of transfer chamber 22 may be altered to facilitate processing. The temperature of transfer chamber 22 may be controlled by adding cold or hot water to a cooling or heating channel 88. There is also a view port 90 through which one can look at the color of the plasma to check for abnormalities during processing in transfer chamber 22.

The plasma source is located above wafer processing stages 86a–86f and is housed in RF shield 68 and comprises six quartz plasma tubes, but only two tubes 611, 612 are shown in FIG. 2B. RF shield 68 may be made of steel or aluminum. A gas inlet line 72 is shown entering a plasma tube 612 which is surrounded by an excitation coil 70 or an induction coil 70 which is wrapped around and coupled to two plasma tubes. A top view of the plasma source is discussed in FIG. 5 and one embodiment of its electrical circuit is illustrated in FIG. 6. An RF (radio frequency) tuner 68 is located between the two plasma tubes.

As used herein, the term "plasma tube" refers to a multiplicity of shapes and dimensions of vessels useful in the generation of plasmas including, but not limited to, a straight tube, circular in cross section with an outer wall and an inner wall, open at both ends and of varying length and diameter, a straight tube similar to the preceding but open at one end and closed at the other, curved tubes, half-dome structures, truncated half-domes, etc. The use of a plurality of any such vessels to produce a plurality of plasma sources within a transfer chamber is within the spirit of the invention.

Figure 3:
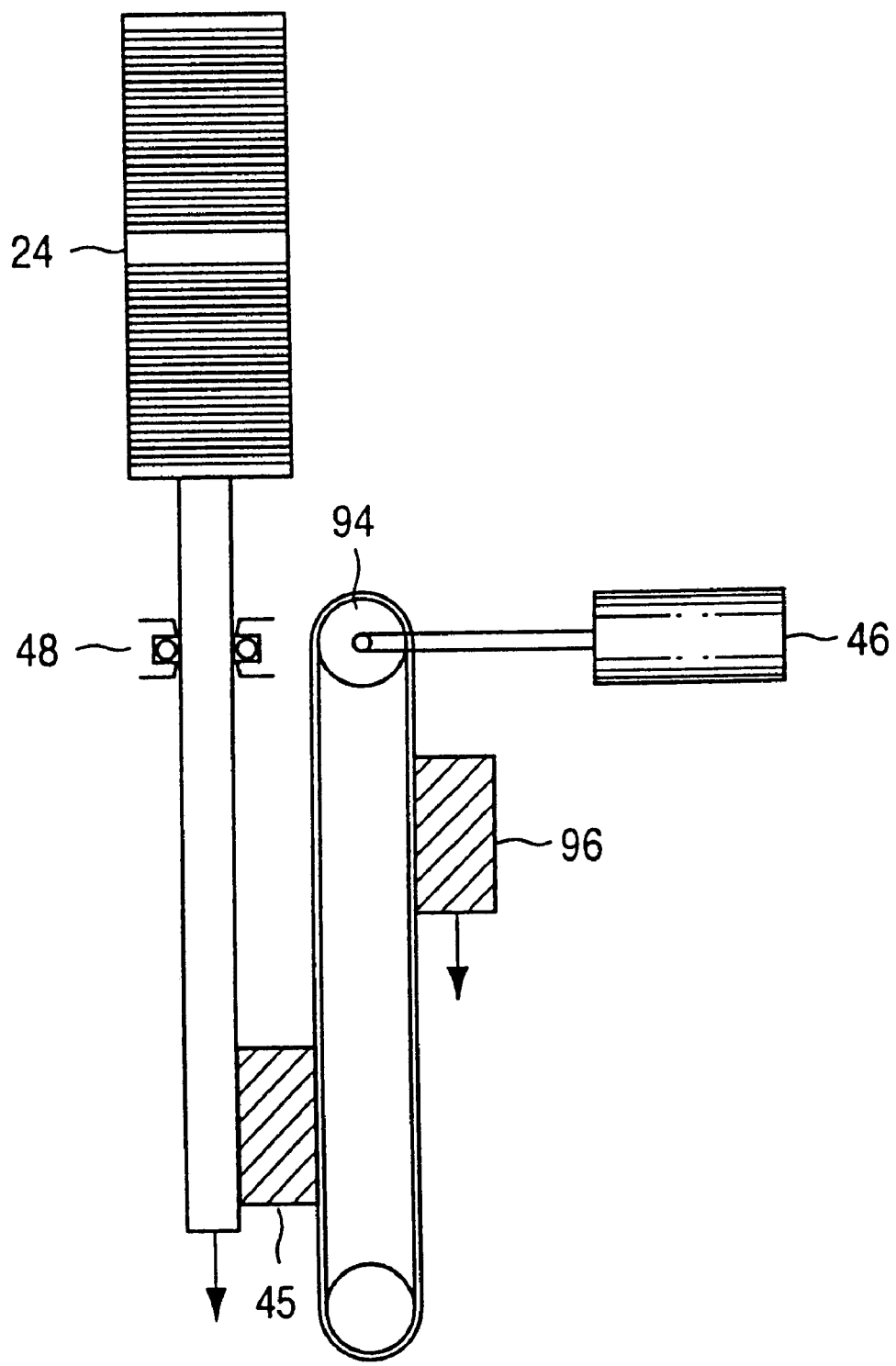
FIG. 3 illustrates the counterbalancing mechanism of the wafer holder, which is disposed within a load lock chamber.

A preferred embodiment of the counterbalancing mechanism of wafer holder 24 is illustrated in FIG. 3. The counterbalancing mechanism prevents wafer holder 24 from crashing and dropping the fifty or less wafers within it because of a power failure. The wafer holder 24 is made of aluminum because the heat from the processed wafers received from the transfer chamber 22 would melt the prior art plastic shelves. Moreover, the plastic cassette holders absorbed quite a bit of moisture from the air which was then outgassed or released into the load lock chamber. This adversely affected the cleanliness of the environment of the load lock chamber. This outgassing effect is decreased by using an aluminum wafer holder 24 with aluminum shelves. In addition, it is easier to control the accuracy of the system with an aluminum wafer holder 24 than with a plastic cassette holder.

The wafer holder's 24 counterbalancing mechanism is accomplished by using a wafer holder weight 45 of about 15–20 pounds coupled to a drive pulley 94 which is coupled to a lead weight 96 of about 15 to 20 pounds. The drive pulley 94 is also coupled to motor 46 which controls the vertical motion of wafer holder 24. Friction provided by linear motion vacuum seal 48 assures that the wafer holder 24 will not move in the event of a power failure and that the two weights, wafer holder weight 45 and lead weight 96, will remain in the same place. This creates a tremendous cost savings because no wafers are damaged or destroyed during a power failure. The savings are amplified when there are processed wafers in wafer holder 24. In contrast, 25 under the prior art systems, the wafer holder dropped all the wafers when there was a power failure which resulted in a great financial loss and a decrease in throughput.

Figure 4:
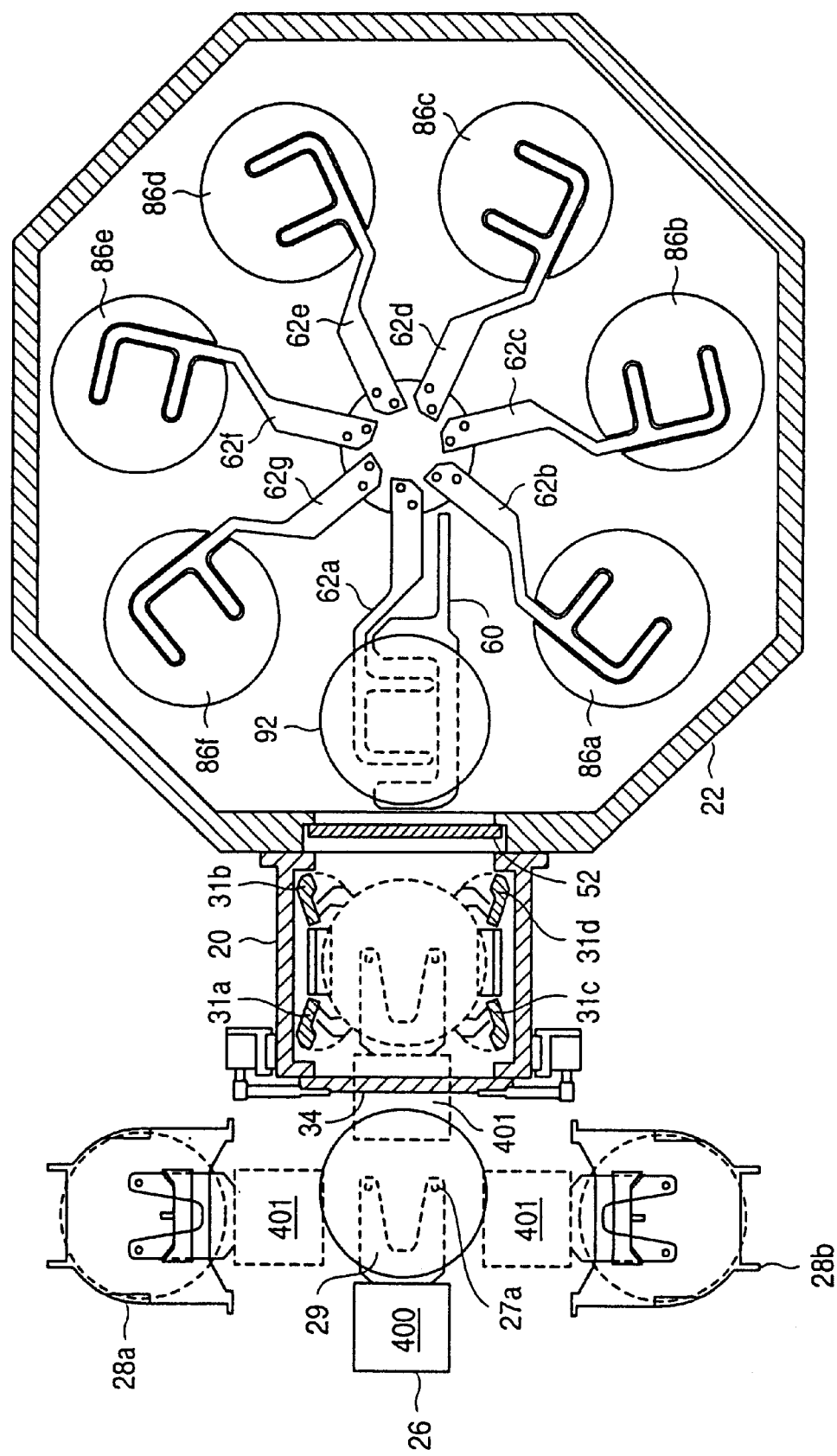
FIG. 4 illustrates one top view of the present invention which shows a wafer transfer blade, six processing stages and seven fins of the transfer chamber.

FIG. 4 illustrates a cross section of the wafer transfer system along cut-away line 4 of FIG. 2. In a preferred embodiment, there are two cassette stages 28a and 28b and each of the cassette stages is capable of holding twenty five wafers. Robot 26 is capable of moving from a home position 400 to an extended position 401 in which its platen 29 is extended into load lock chamber 20 and wafer holder 24 and then back to home position 400. The robot 26 is also in extended position 401 when it is transferring unprocessed wafers from cassette stage 28a, for example, to wafer holder 24 or when it is receiving processed wafers from wafer holder 24 and returning them to cassette stage 28a. This example assumes that the wafers originally came from is cassette stage 28a.

A wafer 92 is shown resting on top of wafer transfer blade 60 and fin 62a. According to a preferred embodiment, wafer transfer blade 60 moves back and forth between load lock chamber 20 and transfer chamber 22. All seven fins 62a–62g are connected to a common central hub 64; thus, all seven fins 62a–62g move simultaneously in a counterclockwise direction when moving a wafer from one stage 86 to another stage 86 during processing. Each of the stages 86a–86f has its own independent temperature control. Thus, all the stages 86a–86f may be set at the same temperature or each at an entirely different temperature. Each fin 62 is capable of moving up with a wafer 92 on the end (not attached to central hub 64) and rotating in a counterclockwise direction to the next stage 86 and then downward with wafer 92 so that wafer 92 will rest on a different stage 86. In addition, the four centering bars 31a–31d also rotate to center the wafers within wafer holder 24 every time before a wafer is transferred. For example, centering bars 31b and 31d move toward each other to center a wafer before wafer transfer blade 60 extends into load lock chamber 20 to either receive or deposit a wafer 92.

Figure 5:
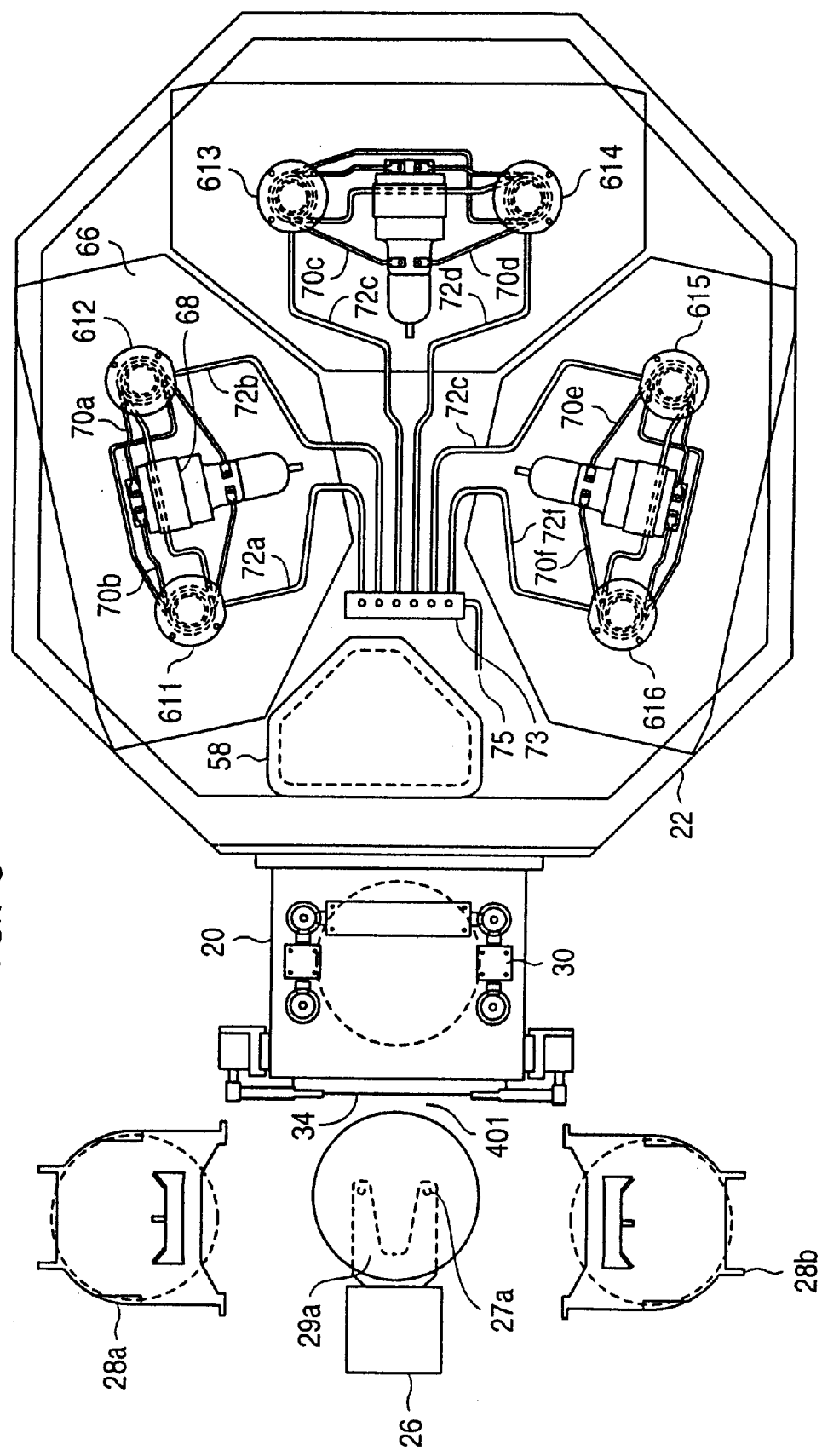
FIG. 5 illustrates another top view of the present invention's plasma source which located above the processing stages.
Figure 6:
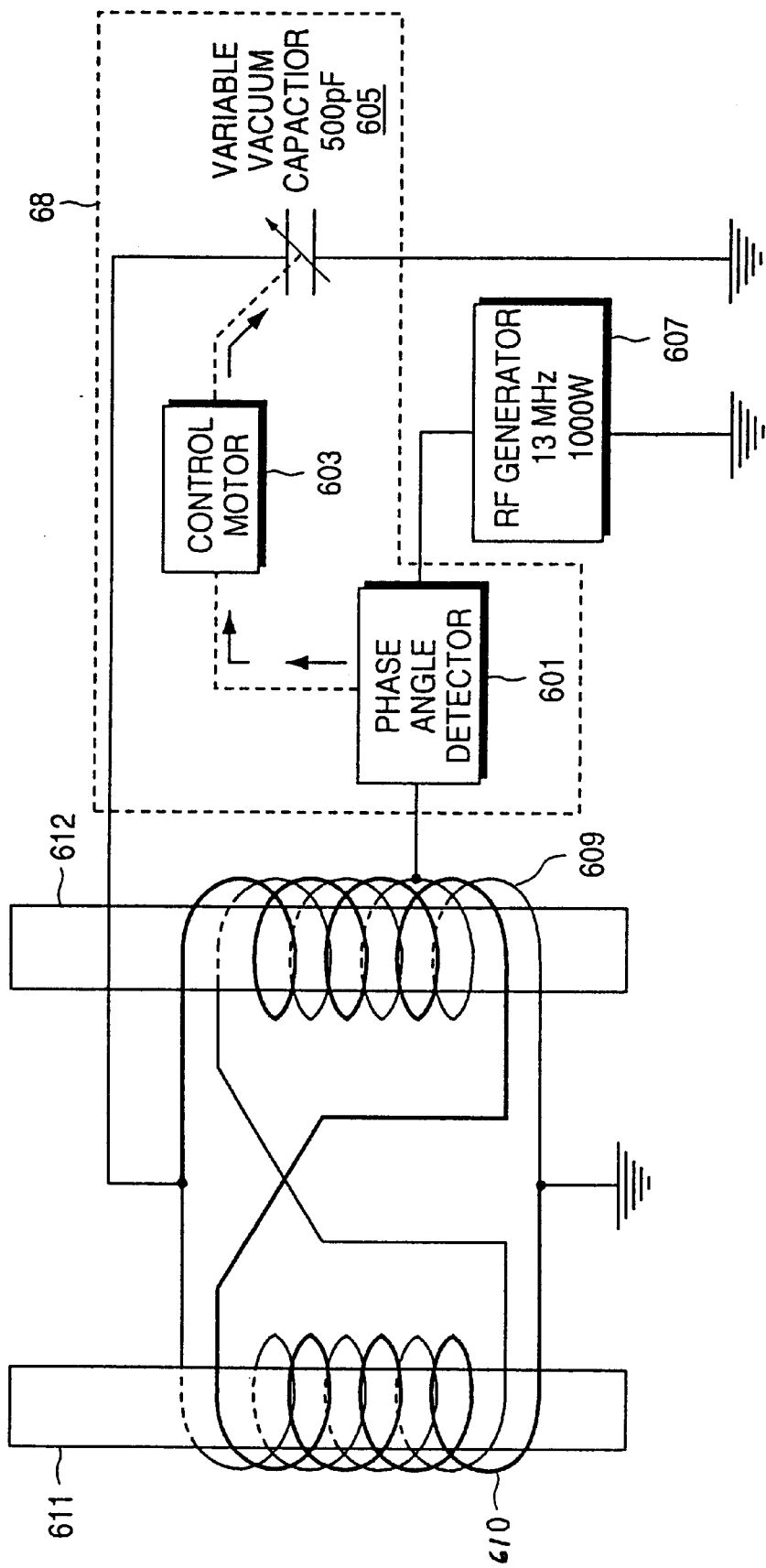
FIG. 6 illustrates one embodiment of the electrical circuit utilized in the plasma source of the present invention.

A cross section of the plasma source of the present invention is illustrated in FIG. 5 which is a cross section along cut-away line 5 of FIG. 2. According to a preferred embodiment, the plasma source comprises six plasma tubes 611–616, each plasma tube being located above a wafer processing stage 86a–86f. The plasma tubes 611–616 are arranged in three pairs. For example, plasma tube 611 is inductively coupled to plasma tube 612 utilizing two induction coils 70a and 70b. Thus, there are two sets of induction coils shared by each pair of plasma tubes. Induction coils 70c and 70d are shared between plasma tubes 613 and 614. Plasma tubes 615 and 616 share induction coils 70e and 70f. Each plasma tube pair shares an RF tuner 68 and an RF generator (not shown). Stripping gas, such as oxygen, enters through the main gas inlet 75, then enters gas divider 73 which divides into six different gas inlet lines 72a–72f. Each gas inlet line 72 is connected to a plasma tube. As the gas passes through the inductive coils which surround the plasma tube, it becomes a charged plasma with electrons, radicals and charged ionic species.

In another aspect of the present invention, one or more of gas inlet lines 72a–72f may not be connected to gas divider 73 but rather may be connected to a separate gas source. This permits different gases to be provided to one or more of plasma tubes 611–616.

Referring to FIG. 6, one embodiment of the electrical circuit of the plasma source is illustrated as a schematic. RF tuner 68 houses a phase angle detector 601 which is coupled to a control motor 603 and a variable vacuum capacitor 605. The RF tuner is also coupled to an RF generator 607 which produces an RF current of about 13.56 mHz (megaHertz) and which generates about 700 to 1,000 watts of power. The phase angle detector 601 causes control motor 603 to adjust vacuum capacitor 605 so that the phase angle becomes 0 in order to maximize efficiency when the RF current is coupled to the plasma. If the phase angle is not 0, then the inductive coupling of the plasma source is not as efficient. That is, if the phase angle is not 0, only a fraction of the power provided by RF generator 607 is available to generate a plasma in plasma tubes 611 and 612. This results in a less than optimal plasma and degradation in performance at the wafer. The tuning of the phase angle to O is done in a conventional manner.

Unlike prior systems, copper induction coils 609 and 610 are coiled differently. Under conventional methods, two identical but separate coils are used so that one coil circles each tube and each coil is connected in parallel to the other coil. If there is a small geometrical difference between the wires or if there is a small difference in pressure between the two plasma tubes, then a difference in the plasma intensity between the two plasma tubes results. Thus, there would be an imbalance in the plasma intensity between the two plasma tubes. This imbalance becomes accelerated as more and more RF current tends to go to the brighter plasma tube (which has the greater plasma intensity). As a result, an uneven plasma is generated from the plasma tubes. The processing of the wafers below the plasma tubes is degraded because of an uneven etch rate caused by the difference in power densities between the plasma tubes. In addition, because one plasma tube is receiving more power, that plasma tube also tends to degrade at a faster rate than the dimmer (weaker plasma intensity) plasma tube. Thus, manufacturing costs increase when a plasma tube must be prematurely replaced.

In contrast, one embodiment of the present invention uses one copper wire 610 which is inductively coupled to both tubes 611 and 612 while another copper wire 609 is also inductively coupled to both tubes. The first end of induction coil 609 is connected to an RF power potential. It then wraps around plasma tube 612 then crosses over and circles plasma tube 611 and then its second end connects to ground. The mirror image occurs with induction coil 610. A first end of induction coil 610 connects to an RF power potential then wraps around plasma tube 611, then crosses over and circles plasma tube 612 and then its second end is connected to ground. The result is that small imbalances of plasma intensity between the two plasma tubes 611 and 612 will not cause more RF current to flow to the plasma tube with a slightly higher (brighter) plasma intensity. Since both induction coils 609 and 610 are equally coupled to both plasma tubes 611 and 612, an imbalance in RF current will not occur. Thus, both plasma tubes will provide an even etch rate to their respective wafers and the plasma tubes will not require premature replacement.

In a further aspect of the present invention, each pair of plasma tubes, 611/612, 613/614 and 615/616, is contained in a separate housing which has a hinge located at the intersection of the housing with the support surface of transfer chamber 22. The hinge is disposed such that the top of the plasma tube housing can rotate in a vertical plane about the hinge causing the top surface of the housing to swing out and down and thereby become perpendicular to the support surface of transfer chamber 22 with the top of the housing facing outward from the apparatus. The top cover plate is fastened to the housing with readily removable fasteners. Thus, easy access to the plasma source; i.e., the plasma tubes, the RF generator, the coils, etc., is provided thereby facilitating inspection, maintenance, part replacement etc. which results in minimal downtime for the apparatus.

The plasma generated by the plasma source can have different plasma structure depending on how it is generated. Of course, the particular gas used to generate the plasma is of prime importance. Other parameters which influence plasma structures include, but are not limited to, the RF power, ion filters, the method of initially creating the plasma and whether a single or dual source is used. By way of example and not limitation, RF power may be supplied in a broad spectrum of powers such as 2.45 GHz, 13.56 MHZ and 400 KHz. Ion filters may or may not be used and if they are used they may be metallic; e.g., aluminum, or non-metallic; e.g., quartz. The plasma may be initially created inductively or capacitively.

In a further aspect of this invention, each coupled pair of plasma tubes; i.e., plasma tubes 611/612, 613/614 and 615/616 may independently generate a different plasma structure within transfer chamber 22. In one embodiment, these different plasma structures may be generated simultaneously so that wafers on, for example, stages 86a and 86b are exposed to one plasma structure while, at the same time, wafers on stages 86c and 86d are exposed to a second plasma structure and wafers on stages 86e and 86f are exposed to yet a third plasma structure. Of course, the plasmas being simultaneously generated must be compatible; i.e. they must not interact and adversely affect the processing of wafers. For example, but without limitation, oxygen and carbon tetrafluoride generate plasmas which are compatible and may exist simultaneously in a processing environment. Other such compatible plasmas are well known to those skilled in the art or can be determined with minimum experimentation.

It is also an embodiment of this invention to generate different plasma structures sequentially so that two wafers can be subjected to one plasma structure on, for example, stages 86a and 86b then, when processing at those stages is completed, the plasma source is turned off, the wafers moved to stages 86c and 86d and there exposed to a second plasma structure. When processing is complete at these stages, that plasma source is turned off, the wafers are moved to stages 86e and 86f and subjected to yet a third plasma structure. When processing is complete at these stages, the completely processed wafers are removed to load lock chamber 20, two new wafers are brought into transfer chamber 22 and the cycle repeated. An advantage of the sequential procedure is that another variable, processing pressure, can also be changed from step to step.

It is further possible to divide the stages into two sets of three wherein each set of three stages provides a different processing environment; for instance, stages 86a/86b/86c may provide one processing environment based on stage temperature and the structure of the plasma generated by plasma tubes 614, 615 and 616 and stages 86c, 86d and 86e may provide an altogether different processing environment, again, depending on the stage temperature selected for those stages and the structure of the plasma produced by plasma tubes 611, 612 and 613. The production of different plasmas in each of inductively coupled plasma tubes 613 and 614 is possible if the characteristics of the gases used, e.g., their impedances, are sufficiently similar. The characteristics of gases used to produce plasmas are well known to those skilled in the art; thus determining which gasses would be compatible so as to permit different plasma structures in two inductively coupled tubes such as 613 and 614 would be a simple matter for such skilled artisans to determine.

Of course, as noted previously, the temperature at each of stages 86a–86f is independently controllable so that the temperature at each stage may be different from that at any other stage(s), as desired.

The net result of the above is that complex multi-step processing may be carried out in a highly efficient manner.

The versatility and capability of the present invention is demonstrated in the following description of applications, which are provided by way of example only and are not to be construed as limiting in any way. One such application is termed in the art "ashing and light etch." This application consists of two steps, 1) photoresist removal; and, 2) poly-silicon oxidation layer removal. The first step is typically performed using an oxygen plasma and a 200° C. stage temperature. The second step is usually performed using carbon tetrafluoride and a lower stage temperature. Previously, the two steps required the use of two separate pieces of apparatus resulting in high operational costs. Using the present invention, not only can the entire application be carried out in one apparatus, the two steps can be performed essentially simultaneously. That is, the apparatus of the invention may be configured so that stages 86a and 86b are set at 200° C. and corresponding plasma tubes 616 and 615 are set to produce a conventional oxygen plasma. Stages 86e and 86f are then set to a lower temperature and plasma tubes 611 and 612 are set to produce a carbon tetrafluoride plasma. Two wafers are loaded onto stages 86a and 86b and exposed to the oxygen plasma. When processing is completed, the processed wafers are moved to stages 86e and 86f while, at the same time, new wafers are transferred to stages 86a and 86b. Then, while the oxygen plasma source (plasma tubes 616 and 615) processes the new wafers just transferred to stages 86a and 86b, the carbon tetrafluoride plasma source simultaneously performs the second processing step on the partially processed wafers which were transferred from stages 86a and 86b to stages 86e and 86f. When both processing steps are no complete, the wafers on stages 86e and 86f are removed from the transfer chamber, the wafers on stages 86a and 86b are moved to stages 86e and 86f, new wafers are loaded onto stages 86a and 86b and the cycle is repeated.

An even more complex application which may be carried out using the present invention is termed in the art "post poly etch side wall removal." This application consists of four (4) steps: 1) photoresist removal accomplished by an oxygen plasma at a stage temperature of 200° C.; 2) silicon-containing side-wall removal which is typically done with carbon tetrafluoride plasma at a stage temperature which is essentially room temperature; 3) carbon-containing side-wall removal, done with an oxygen plasma at a 200° C. stage temperature; and, finally, 4) oxidation layer removal which is accomplished by a plasma produced from a combination of oxygen and carbon tetrafluoride at, again, room temperature stage temperature. The stages and plasma sources are set so that, for example, stages 86a and 86b are set at 200° C. while stages 86c, 86d, 86e and 86f are held at room temperature. Plasma tubes 616 and 615 are set to generate an oxygen plasma. Plasma tubes 613 and 614 are set to produce a carbon tetrafluoride plasma. Plasma tubes 615 and 616 are prepared to generate an oxygen/carbon tetrafluoride combination plasma. For this application, only two wafers are loaded into transfer chamber 22 at a time. The wafers are first placed on stages 86a and 86b and step 1) carried out. The plasma source is then turned off at plasma tubes 616 and 615 and the wafers are moved to stages 86c and 86d where step 2) is performed. When processing is complete, plasma generation by plasma tubes 613 and 614 is ceased and the wafers are moved back to stages 86a and 86b where a plasma is once again generated from plasma tubes 616 and 615 and step 3) is carried out. Next, plasma generation at plasma tubes 616 and 615 is once again stopped, the wafers are moved to stages 86e and 86f, the oxygen/carbon tetrafluoride combination plasma is created and step 4) is accomplished. When step 40 is complete, the two fully processed wafers are removed from transfer chamber 22 to load lock chamber 20, two new wafers are transferred from load lock chamber 20 to transfer chamber 22 and the cycle is repeated. Thus, an extremely complicated application is carried out in one apparatus. No manipulation of stage temperatures or plasma sources other than initial set up, stage temperature adjustment and the turning on and off of the three different plasma sources is required. These manipulations are easily performed, and, in fact may be programmed into a recipe which permits automatic performance of the entire cycle, including removal of fully processed wafers from the transfer chamber and introduction of new wafers into the transfer chamber to begin a new cycle.

Other arrangements of plasma sources, stage temperatures, processing sequences, etc. to carry out other applications using the present invention will be apparent to those skilled in the art and are within the scope of this invention.

Figure 7:
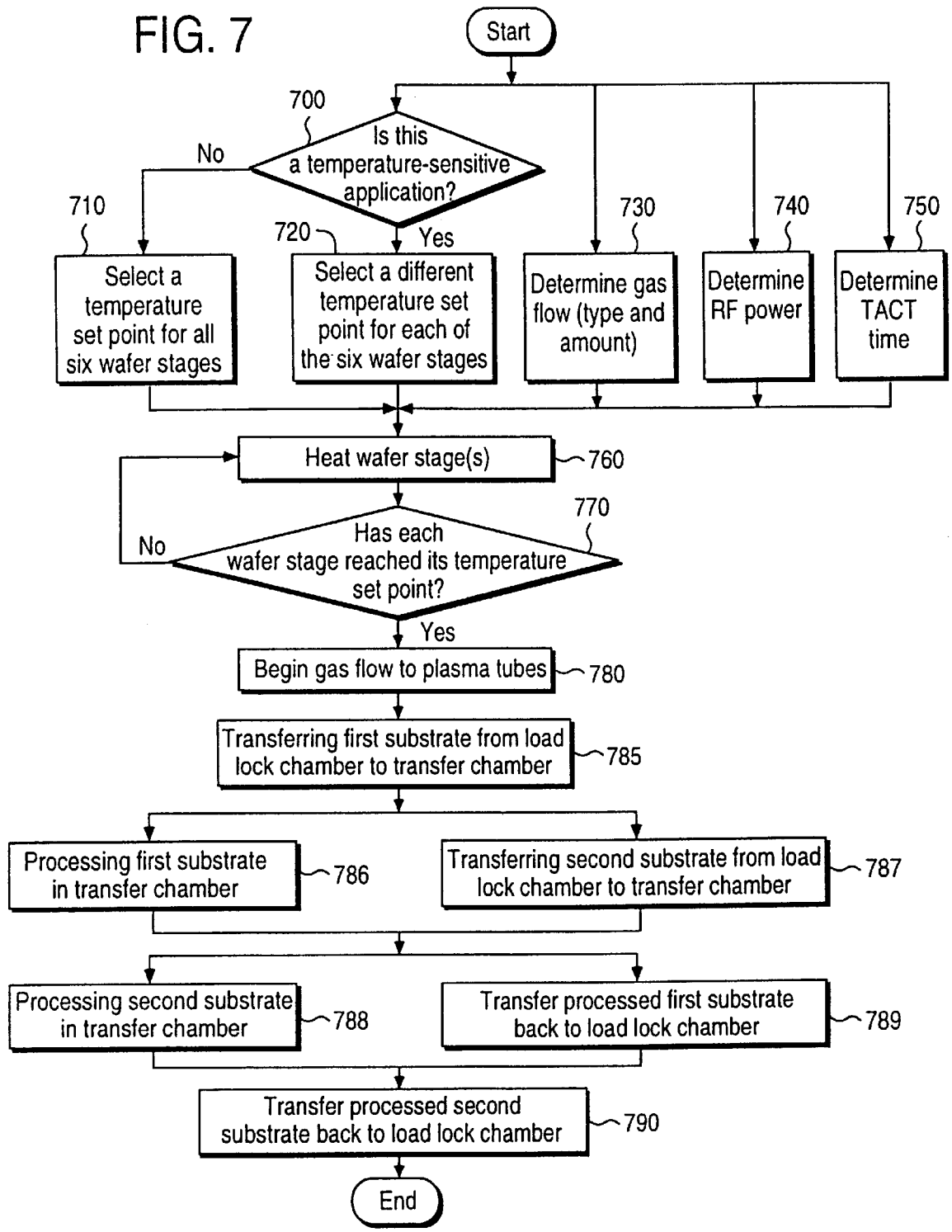
FIG. 7 is a flow chart of a preferred method of the present invention.
Figure 8:
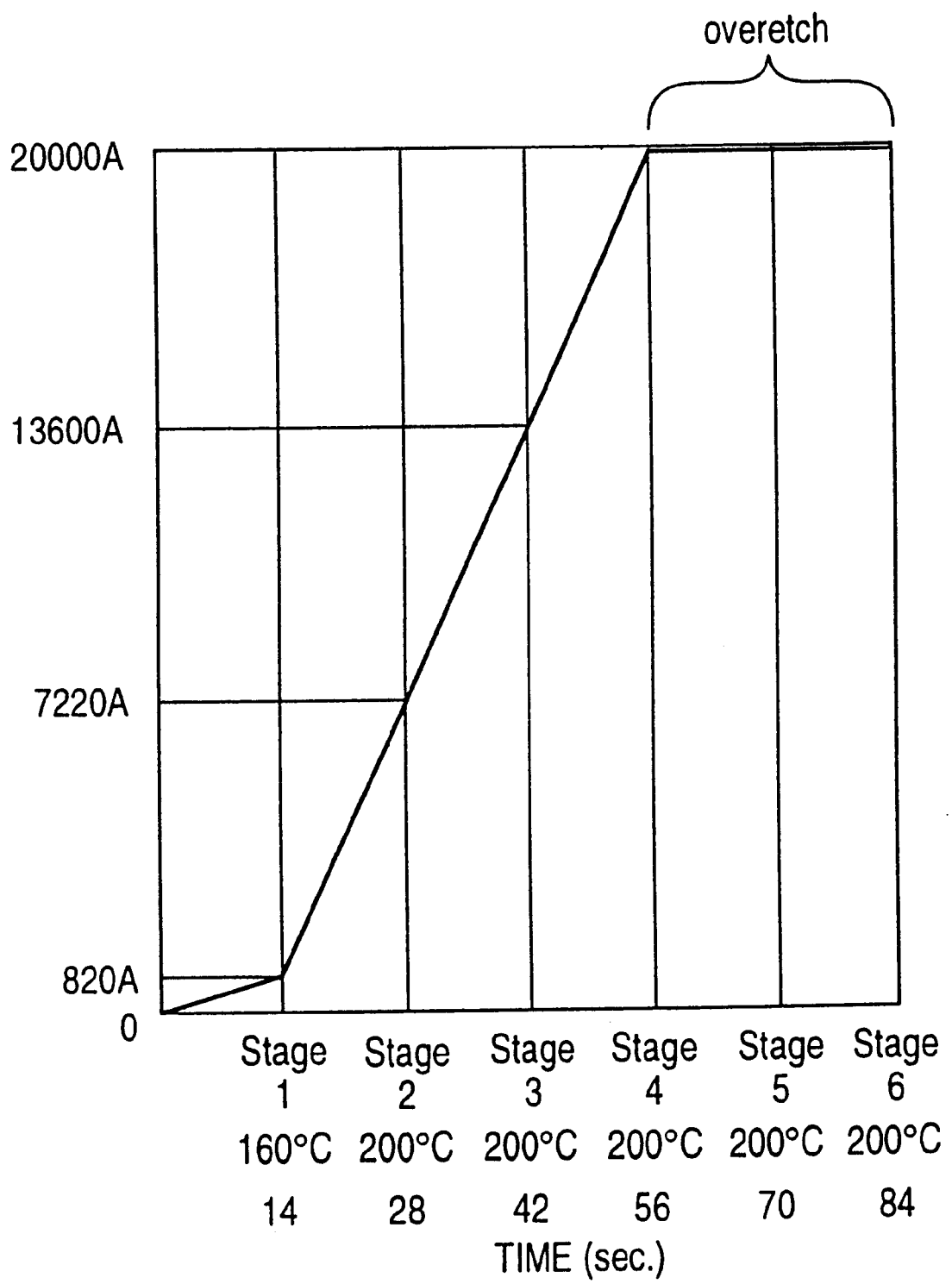
FIG. 8 is a graph illustrating the amount of resist removed over time utilizing a non-temperature sensitive application of the present invention.

A flow chart of a preferred method of the present invention is illustrated in FIG. 7. According to a preferred embodiment, an operator selects a recipe by determining certain parameters using a type of control system, such as a computer program. As shown in diamond 700, an operator decides whether a temperature sensitive application is desired. If a non temperature sensitive application is selected, then the operator may select a temperature set point for all six wafer stages as shown in block 710 or a common temperature set point for five of the six wafer stages as shown in FIG. 8. Stripping of the photoresist off the wafer surface after etching a contact or a via is an example of a non-temperature sensitive application of the present invention.

If a temperature sensitive application is desired, then the operator will select a different set point for each of the six wafer processing stages, as shown in block 720. Photoresist removal after an ion implantation step (e.g., a heavy arsenic dope) is an example of a temperature sensitive application. Because each of the six wafer processing stages has its own temperature control, it provides the advantage of allowing a slow heat-up during the photoresist strip process. If the wafer surface is exposed to an abrupt increase in temperature, then good process performance is not obtained because of a phenomenon known as "explosion" of the resist film. In other words, the photoresist film explodes if the wafer is heated too suddenly. The present invention is designed to avoid "explosion" by the gradual heat-up of the wafer and also by applying RF power incrementally since the RF power also adds heat to the wafer surface. In parallel, an operator may also determine the gas flow, such as the type and the amount in sccm (standard cubic centimeters) of gas provided as shown in block 730.

In tandem, an operator may determine the amount of RF power to be provided and the tact time, as shown in blocks 740 and 750, respectively. The RF power provided may be selected from a range of about 1 kilowatt (kw) 10 kw. The radio frequency applied is between about 200 kiloHertz (kHz)–27 megaHertz. According to a preferred embodiment, 3 kw of power is provided and the radio frequency is set at about 13 MHZ. The tact time is defined as processing time plus fin index time. Theoretically, the tact time selected may be anywhere from twenty seconds to infinity. A typical tact time is 20 seconds which is significantly lower than the tact time of 42 seconds obtained under the prior art system 100. The processing time is the amount of time that a wafer spends on a processing stage. As earlier defined, the fin index time is the time it takes for one fin to move up from a first stage while carrying a wafer, rotating to a second stage, then moving down and depositing that wafer on the second stage. The fin index time may be set anywhere from twelve seconds to infinity. Although from a throughput perspective, a lower fin index time is desirable. According to a preferred embodiment, the fin index time is twelve seconds. The vacuum pressure inside the transfer chamber may be set from atmospheric pressure to 10–7 torr. However, a vacuum pressure of 5 torr is selected under a preferred embodiment.

Once the temperature set point is selected for each of the six wafer processing stages, then heat is immediately provided to the wafer processing stages as shown in block 760. In one embodiment, an operator places from one to twenty-five wafers-into a cassette stage. An operator may also use two cassette stages. An operator may choose to put twenty-five wafers into a cassette stage or only one. If an operator places one wafer at the top shelf of the cassette stage and then another one at the bottom of the same cassette stage, the system will assume that there are wafers in the empty shelves so as not to degrade tact time. The amount of time that a wafer spends in the transfer chamber is critical because that is when the wafer is exposed to the plasma under a certain temperature. Thus, the present invention is designed so that a wafer will get the same amount of processing time regardless of whether there are two wafers or twenty-five wafers in a cassette stage. Thus, process performance does not decline if less than the maximum number of wafers is processed in the transfer chamber.

As shown in diamond 770, the system will check to see if each wafer processing stage has reached its temperature set point. If the answer is yes, the system will begin gas flow to the plasma tubes as shown in block 780. According to a preferred embodiment, a gas flow comprising 80% of $O_2$ gas and 20% of $N_2$ gas is used. By this point, the system is operating automatically based on the selected parameters. It is to be appreciated that the parameters may be pre-selected in the software without departing from the spirit and scope of the patent invention.

Before transferring a first substrate or wafer from the load lock chamber to the transfer chamber as shown in block 785, the system will go through several checkpoints. First, the system will check to see if there are any wafers present in the wafer holder or on the fins. If no wafers are found, then the system begins the transfer sequence. Second, the system will check to make sure that the load lock chamber is at atmospheric pressure. If the system determines that the gate valve is open then it will proceed to the next step, but if the gate valve is not open, the system will open the gate valve to bring the load lock chamber to pressure.

The atmospheric robot will rotate to the first cassette stage, and then extend its twenty-five platens into first cassette stage to pick up, for example, twenty-five wafers. Without touching the wafers, the robot will fully extend its twenty-five platens which are then moved up by about 0.1 inch. Next, the vacuum chuck for each platen is turned on in order to hold each wafer in place. Each of the platens will then retract and return back to home position. The robot then rotates toward the load lock chamber. The twenty-five platens then extend away from the robot and into the load lock chamber. The vacuum chuck then releases so that there is no more vacuum suction on the platens. The wafer holder moves up by 0.1 inch in order to pick up all twenty-five wafers from the platens. The twenty-five wafers are then transferred into the twenty-five shelves of the first or second compartment of the wafer holder. The centering mechanism then closes to center the wafers then opens again. The twenty-five platens retract back to home position.

Two events happen simultaneously. The wafer holder moves to the next compartment so that the next compartment's shelves are adjacent to the gate valve and are ready to receive the next twenty-five wafers from a second cassette stage. This example assumes the operator wants to process fifty wafers. At the same time, the robot will repeat the same sequence for the second cassette stage as it retrieves the twenty-five wafers and transfers them to the wafer holder. While this has been happening, the transfer chamber has been under vacuum and the slit valve has been closed. Once the robot has finished transferring the twenty-five wafers from the second cassette stage into the wafer holder, the gate valve is closed.

The load lock chamber is then pumped down from atmospheric pressure until it reaches the same pressure as the transfer chamber. At the same time, the wafer transfer system begins flowing gas into the plasma generation tubes and controlling the transfer chamber pressure by controlling a throttle valve (which is not shown). The transfer chamber is generally at a pressure of about 200 milliTorr (mT) when the wafer transfer system is idle. As shown in diamond 770 and block 780, the system will not start the gas flow until each of the wafer processing stages has reached its temperature set point. During the processing of wafers, the transfer chamber is set at about 2,000 mT according to a preferred embodiment. In one embodiment, about 5,000 sccm $O_2$ (oxygen) gas is released into the plasma tubes. In yet another embodiment, 500 sccm of $N_2$ (nitrogen) gas is also released with the $O_2$ gas into the plasma tubes.

In order to ignite the plasma, the wafer transfer system will provide the selected amount of RF power. By that time, the load lock chamber should be at the same pressure as the transfer chamber. The phase angle detector starts measuring the phase angle between the RF generator signal and the signal through the induction coil. The difference in phase angle between the two signals is sent to the control motor as part of a feedback control loop. The control motor then adjusts the vacuum capacitor in order to set the phase angle at 0. The vacuum capacitor, in turn, controls the phase of the RF current provided to the induction coils. The transfer chamber is now ready to receive wafers for processing as the pressure, the gas flow, the temperature of wafer processing stages and the RF power are all within a predetermined range.

The slit valve is opened and the transfer sequence (see block 785) begins in order to allow processing of a first wafer in the transfer chamber as shown in block 786. The wafer holder will move to a shelf where the first wafer is located, often it is the top shelf; however, an operator may set the system so that the first wafer is at the bottom of the wafer holder and the last wafer is on the top shelf. The wafer transfer blade will extend into the wafer holder and at the same time, the centering bars will center the wafers by moving toward each other and then opening. The wafer transfer blade is inserted beneath the first wafer which is on the top shelf. The wafer holder will then move down by about 0.1 inch so that the wafer is now resting on the wafer transfer blade. The wafer transfer blade retracts to home position so that it and the wafer are within the transfer chamber. A wafer is processed the moment the wafer enters the transfer chamber as the plasma immediately begins to strip the resist from the wafer surface.

The fin index motion occurs when the wafer is resting on the wafer transfer blade and a first fin. This first fin will then move up and then rotate by about 51.7 degrees to a first processing stage and then it will move down until the wafer rests on a first stage. At the same time, the wafer holder will move up to expose a second wafer on the shelf beneath the top shelf. A second wafer (or substrate) is transferred from the load lock chamber and into the transfer chamber, as shown in block 787, during the processing of the first wafer as seen in block 786. The entire sequence is repeated six times until there are six wafers and each wafer is on one of the six processing stages within the transfer chamber. All six stages are connected to ground in one embodiment. However, in another embodiment, the first processing stage, which is located in a counterclockwise direction from the wafer transfer blade, may be RF biased in order to process a particularly hardened resist known as a "shell" on the wafer surface.

Once the first wafer has been processed on each of the stages and is on the sixth processing stage, the fin index motion transfers that first wafer back to the wafer transfer blade. The wafer holder which was on the sixth shelf will now move back to the top shelf where this first wafer originated. The wafer transfer blade then extends into the top shelf of the wafer holder. The wafer holder moves up by about 0.1 inch so that the processed wafer is returned to the top shelf. The wafer transfer blade then retracts to home position so that it is inside the transfer chamber. At the same time, the wafer holder will then move to the seventh shelf so that the wafer transfer blade may then pick up and transfer this unprocessed seventh wafer into the transfer chamber. After the seventh wafer is introduced into the transfer chamber, the system repeats the above transfer sequence thirty-six times. Each wafer is transferred from stage to stage until each wafer has been processed on all six stages. The unloading sequence is repeated a final seven times when the last seven processed wafers are unloaded from the transfer chamber and returned to their original shelves on the wafer holder. As shown in blocks 788 and 789, a processed wafer may be returned to the load lock chamber while another wafer continues to be processed in the transfer chamber. At the end of the process, all of the wafers are returned to their original shelves in the wafer holder as shown in block 790.

It is to be understood that the present invention may also be used in a standard batch processing format wherein six new wafers are loaded into the transfer chamber, all six wafers are simultaneously processed under substantially the same conditions, all six processed wafers are removed, six more new wafers are transferred into the transfer chamber and the process repeated.

It is also to be appreciated that the stripping of photoresist from the wafer surface is not the only process that can occur in the transfer chamber. Light etching after a film deposition or a chemical vapor deposition may occur utilizing the present invention. If a chemical vapor deposition process is utilized under the present invention, the plasma source is capacitively coupled instead of inductively coupled.

Once all fifty processed wafers are returned to their original shelves in the wafer holder, the slit valve is closed so that the load lock chamber is isolated from the transfer chamber. It is to be appreciated that the system may process less than fifty wafers at one time. The wafer transfer system then turns the RF power off and stops gas flow into the plasma tubes. The throttle valve is then opened to bring the pressure in the transfer chamber back to its base pressure of about 200 mT. The wafer transfer system starts introducing nitrogen gas into the load lock chamber for venting purposes. In a preferred embodiment, about 100 sccm of nitrogen gas will be introduced until the pressure in the load lock chamber reaches about 10 torr and then the main venting valve (not shown) is opened until the pressure in the load lock chamber reaches atmospheric pressure.

The gate valve is then opened and another wafer unloading sequence begins. First, the centering bar mechanism centers the wafers in the wafer holder. Second, the robot extends its twenty-five platens into the wafer holder. The centering mechanism then opens after centering the wafers. The wafer holder then moves down by about 0.1 inch so that all twenty-five wafers are resting on the twenty-five platens. The vacuum chuck for each platen is turned on so that each wafer is chucked onto its respective platen. The platens retract back to home position. Next, the robot rotates with its twenty-five platens toward the first cassette stage. The robot will then extend its twenty-five platens toward the first cassette stage. The vacuum chuck is then turned off and the atmospheric robot moves down by about 0.1 inch so that all twenty-five platens retract to home position after the twenty-five wafers are returned to their original shelves in the first cassette stage. In parallel motion, as the robot is rotating toward the first cassette stage, the wafer holder is moving its second compartment upward so that the next twenty-five wafers may then be unloaded and returned to their original slots in the second cassette stage 5. This example assumes that fifty wafers were processed.

A graph of the amount of resist removed or ashed during an actual non-temperature sensitive application of the present invention is illustrated in FIG. 8. Wafer processing stage 1 is set at 160 degrees Celsius (C.) while stages 2–6 are set at 200° C. The cumulative time elapsed is shown on the x-axis below each wafer processing stage. At station 1, 820 angstroms of resist was stripped from the wafer surface. A dramatic increase is seen by the time the wafer leaves stage 2, as a total of 7220 angstroms has now been removed from the wafer surface. At stage 3, a total of 13,600 angstroms of resist has been removed while a total of 20,000 angstroms of resist has been removed by the time the wafer leaves stage 4. A total of fifty-six seconds has elapsed. Overetching or removal of any residual resist occurs at processing stages 5 and 6. Thus, a typical non-temperature sensitive stripping process should take about eighty-four seconds for one wafer. Generally, about 15,000–20,000 angstroms of photoresist is removed per wafer. In a non-temperature sensitive application, the temperature set point for each of the stages may range from room temperature to about 400° C.

Figure 9:
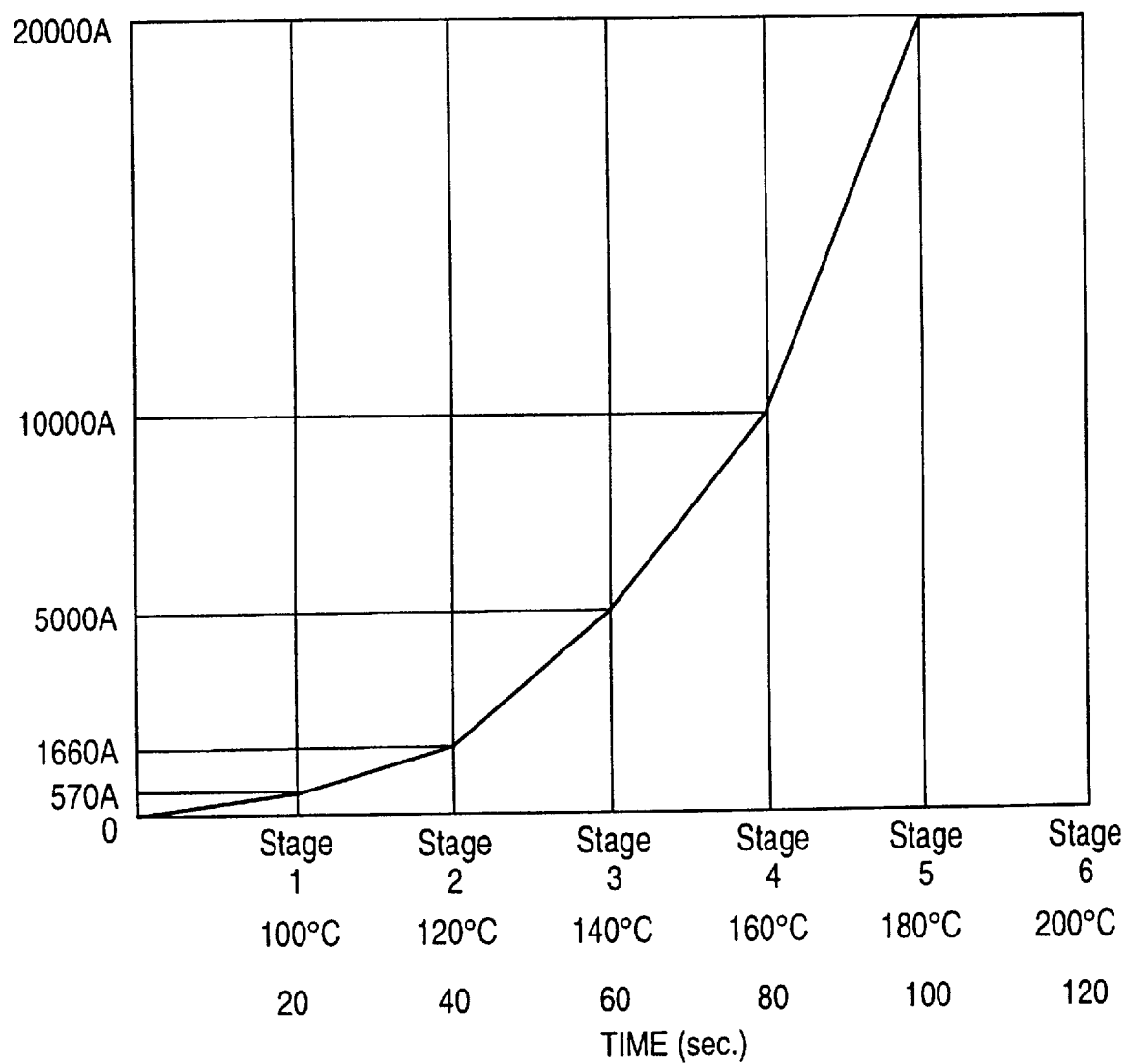
FIG. 9 is a graph illustrating the amount of resist removed over time per processing stage based on a temperature sensitive application of the present invention.

A graph of the etch rate or the amount of resist ashed utilizing a temperature sensitive application of the present invention is illustrated in FIG. 9. The cumulative amount of photoresist etched or ashed per wafer is shown on the Y axis while the cumulative amount of time elapsed in seconds and the temperature of each wafer processing stage is shown on the X axis. Each of the wafer processing stages is set to a different temperature set point to allow a gradual heat-up of the wafer. The first wafer stage is set at 100° C., the second wafer processing stage at 120° C., the third stage at 140° C., and so on in 20° C. increments until a temperature of 200° C. is achieved at processing stage 6. It is to be appreciated that the numbers shown in the graph illustrate only one application of the present invention and that other temperature ranges may be selected depending on the particular application desired.

The slope of the amount etched is not as sharp for a temperature sensitive process as it is for a non-temperature sensitive process because of the gradual heat-up of the wafer. At the end of the wafer's processing time at stage 1, only 570 angstroms of resist was removed as compared to the 820 angstroms removed in the non-temperature sensitive application. The difference is most dramatic at stage 2 where only a total of 1,660 angstroms has been removed by the time the wafer leaves processing stage 2 after forty seconds elapsed. In sharp contrast, a total of 7,220 angstroms was removed after twenty-eight seconds in the non-temperature sensitive application. A total of 3,340 angstroms (5,000 minus 1,660) is removed at processing stage 3 in FIG. 9. After eighty seconds, a cumulative total of 10,000 angstroms is removed at the end of processing stage 4. Finally, the etch is completed at processing stage 5 and the overetch occurs at processing stage 6 after 120 seconds have elapsed. In the typical example, about 15,000 to 20,000 angstroms of resist is ashed or removed per wafer. In another embodiment, the first processing stage is set at 80° C., the second processing stage at 105° C., the third processing stage is set at 130° C., and a fourth processing stage is set at 155° C. while the fifth stage is set at 180° C. and the sixth stage at 210° C.

In the above description, numerous specific details, such as the use of oxygen as a stripping gas, the number of shelves in the wafer holder or the use of a particular temperature set point, are given to be illustrative and not limiting of the present invention. It would still be clear to one skilled in the art that the spirit and scope of the invention may be practiced without these specific details. Moreover, in some instances, well-known semiconductor equipment and processes have not been set forth in detail in order not to unnecessarily obscure the present invention. Thus, the apparatus and method of the present invention is defined by the appended claims.

Thus, an apparatus and method have been described for stripping the photoresist from a wafer while in a substantially parallel manner, another wafer is being transferred between a load lock chamber and a transfer chamber, where the processing occurs. Further, an apparatus and method have been described for performing multi-step applications requiring different conditions for two or more of the steps wherein the steps may be performed simultaneously or sequentially. The wafer transfer system of the present invention allows increased throughput with decreased manufacturing costs and without introducing any contamination concerns.

What is claimed:

1. A device for processing a plurality of wafers comprising:

a transfer chamber within which processing of said plurality of wafers takes place;

a load lock chamber coupled to said transfer chamber;

a plurality of independent temperature controlled stages located within and coupled to said transfer chamber, said stages being disposed at a predetermined radius from a hub concentrically located within and operatively coupled to said transfer chamber, each of said plurality of stages being capable of supporting one of said plurality of wafers during processing;

a transfer blade located within and operationally coupled to said transfer chamber, said transfer blade having a retracted and an extended position; in said retracted position said transfer blade is located at said predetermined radius, in said extended position said transfer blade is in said load lock chamber, said transfer blade being capable of transferring said plurality of wafers one at a time from said load lock chamber to said transfer chamber or from said transfer chamber to said load lock chamber while others of said plurality of wafers are being processed on said plurality of stages within said transfer chamber;

a plurality of fins having a first end and a second end said first end, of each of said fins being coupled to said hub, said second end of each of said fins being located at said predetermined radius and communicating with one of said plurality of stages, said plurality of fins being capable of transferring one of said plurality of wafers from said transfer blade or one of said plurality stages to another of said plurality of stages or back to said transfer blade;

a robot coupled to said load lock chamber, said robot having a plurality of platens, each of which said plurality of platens being capable of supporting one of said plurality of wafers and transferring said wafer to and from said load lock chamber;

a wafer holder having a plurality of shelves, said wafer holder being located within said load lock chamber, each of said plurality of shelves being capable of communicating with said robot;

a plurality of plasma sources coupled to said transfer chamber, each of said plasma sources being located above one of said plurality of stages; and, a plurality of gas inlet tubes, each of said gas inlet tubes being connected to one of said plurality of plasma sources, the remote end of each of said plurality of gas inlet tubes being connected to one of a plurality of gas sources, each of said gas sources being capable of providing a different gas to said plasma source.

2. The device of claim 1 wherein, said plurality of shelves comprises 50 shelves for holding wafers to be processed or wafers which have been processed and 6 shelves for holding dummy wafers.

\* \* \* \* \*